United States Patent [19]

Tanabe et al.

[11] Patent Number: 5,075,096
[45] Date of Patent: Dec. 24, 1991

[54] METHOD OF VAPOR-PHASE SYNTHESIZING DIAMOND

[75] Inventors: Keiichiro Tanabe; Naoji Fujimori, both of Hyogo, Japan

[73] Assignee: Sumitomo Electric Industries, Ltd., Osaka, Japan

[21] Appl. No.: 466,992

[22] Filed: Jan. 18, 1990

[30] Foreign Application Priority Data

Jan. 24, 1989 [JP] Japan ................................. 1-15456

[51] Int. Cl.$^5$ .............................................. C01B 31/06
[52] U.S. Cl. .................................................... 425/446
[58] Field of Search ............... 423/446; 156/DIG. 68; 201/38

[56] References Cited

U.S. PATENT DOCUMENTS

| | | | |
|---|---|---|---|
| 3,449,168 | 6/1969 | Sederquist | 423/653 |
| 3,599,610 | 8/1971 | Spector | 423/168 |
| 4,483,836 | 11/1984 | Adadvov et al. | 423/446 |
| 4,522,680 | 6/1985 | Ogawa | 423/446 |
| 4,767,608 | 8/1988 | Matsumoto et al. | 423/446 |

FOREIGN PATENT DOCUMENTS 0286306 10/1988 European Pat. Off. .
0297845 1/1989 European Pat. Off. .
0324538 7/1989 European Pat. Off. .

OTHER PUBLICATIONS

Applied Physcis Letters, vol. 51, No. 10, Sep. 7, 1987, pp. 737-739 American Institute of Physics, New York S. Matsumoto et al, "Synthesis of Diamond Films in a rf Induction Thermal Plasma", p. 737, Col. 2.

*Primary Examiner*—Michael Lewis
*Assistant Examiner*—Stuart L. Hendrickson
*Attorney, Agent, or Firm*—Cushman, Darby & Cushman; Cushman, Darby & Cushman

[57] ABSTRACT

Disclosed is a method of vapor-phase synthesizing diamond comprising creating a reduction atmosphere by burning a combustible gas in a combustion-supporting gas, controlling the humidity by adding steam or liquid water drops to the combustion flame, and inserting a basic material into the synthesis flame. This method produces diamonds of the desired reproducibility and crystallinity, with an industrially-acceptable rate of film growth, while simultaneously ensuring the process stability necessary for long-duration synthesis.

14 Claims, 2 Drawing Sheets

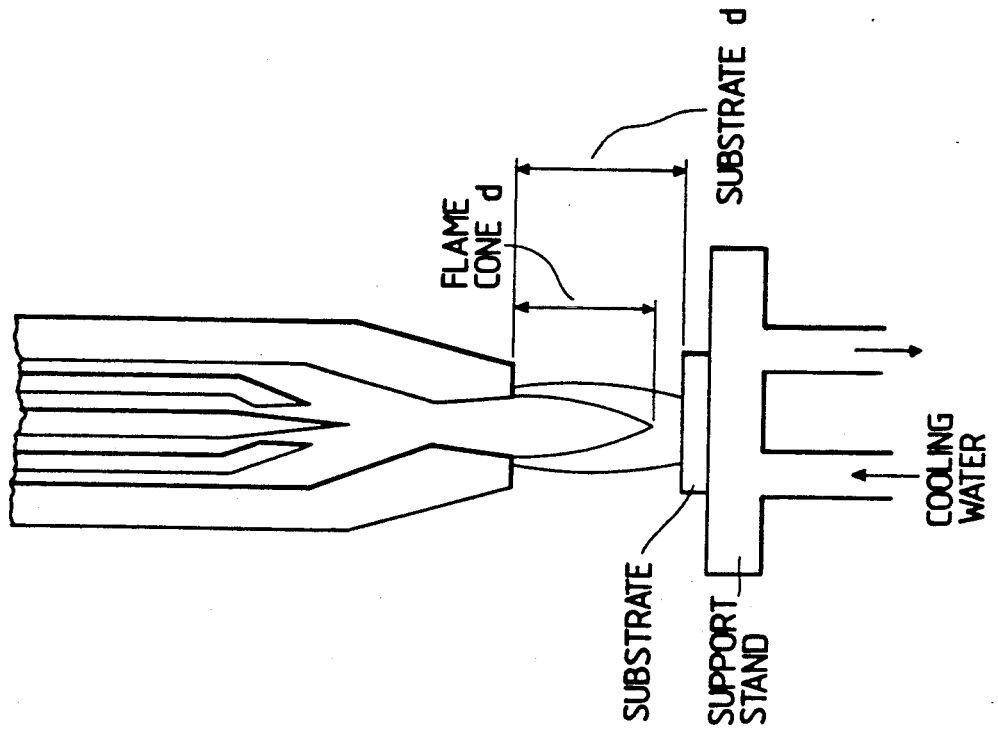
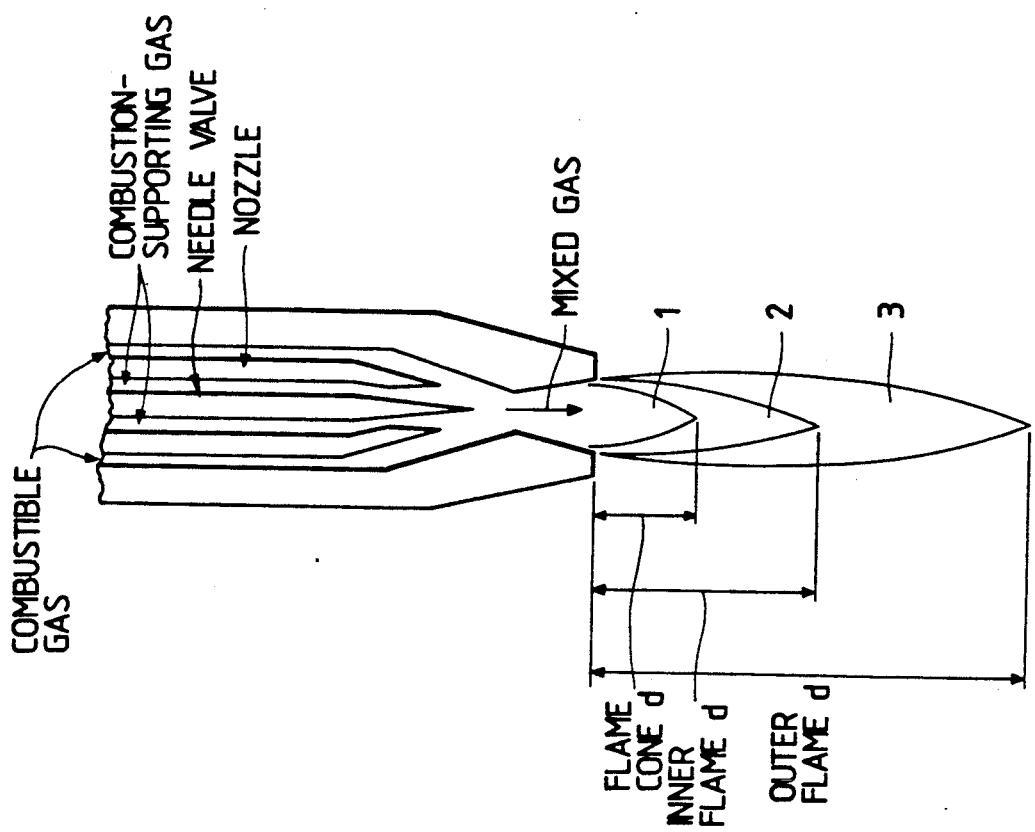

METHOD OF VAPOR-PHASE SYNTHESIZING DIAMOND

BACKGROUND OF THE INVENTION

1. Field of the Invention

The present invention relates to a vapor-phase method of synthesizing diamond, and more particularly relates to a vapor-phase method employing a combustion flame. The diamond produced by this method is suitable for numerous applications including use as semiconductor elements requiring high purity, high crystallinity, high heat conductivity, low dielectricity, high light-transmissivity, high anelasticity, high strength, high abrasion resistance, high-durability, and high-temperature operability. Advantages of use of the present method include inexpensive synthesis, high-speed production, and stability of the synthesis operation.

2Description of the Related Art

Conventionally, artificial diamond has been synthesized in a thermodynamic equilibrium under high temperature and high pressure. Recently, however, it has become possible to synthesize diamond in the vapor phase. In the vapor-phase synthesis method, hydrocarbon gas diluted with ten times or more hydrogen is excited in a reaction chamber by means of plasma or a heat filament to form a diamond layer on a basic material. In this method, however, the evaporation speed of 0.1-2 $\mu$m/h is so low as to render the method unsuitable for industrial use.

In the 35th Applied Physics Related Joint Lecture Meeting (April 1988), Hirose, et al. of Nippon Kodai reported that diamond could be synthesized by use of a combustion flame.

Further, in New Diamond, Vol. 4, No. 3, pp. 34-35, a diamond synthesis method employing a combustion flame has been disclosed.

Synthesis of diamond in the vapor phase by means of a combustion flame is such a new process, however, that suitable synthesis conditions have heretofore not been discovered. Numerous problems have been encountered in the prior art in providing a diamond of acceptable reproducibility and crystallinity, with an industrially-acceptable rate of film growth, while simultaneously ensuring the process stability necessary for long-duration synthesis.

More specifically, the vapor-phase combustion method, as opposed to conventional vapor-phase synthesis, produces super saturation of the carbon material. As a result, surface graphitization and surface amorphousization occur, inhibiting the deposition of a diamond of the desired crystallinity. This limits the synthesis run length during which stable operation can be expected to a commercially-infeasible period of less than several hours.

SUMMARY OF THE INVENTION

It is an object of the present invention to provide a method of vapor-phase synthesizing diamond capable of producing diamonds of the desired reproducibility and crystallinity, with an industrially-acceptable rate of film growth, while simultaneously ensuring the process stability necessary for long-duration synthesis.

It has been found that the humidity of the synthesis atmosphere is influential in determining the stability of synthesis, the rate of growth, the area of deposition, and the degree of diamond crystallinity.

It is therefore another object of the present invention to provide a method of vapor-phase synthesizing diamond under conditions of humidity not lower than 35% but not higher than 80%.

According to the present invention, there is provided a method of vapor-phase synthesizing diamond comprising:

creating a reduction atmosphere by burning a combustible gas in a combustion-supporting gas;

controlling the humidity of the reduction atmosphere by adding steam or liquid water drops to the combustion flame;

inserting a basic material into the combustion flame; and forming the diamond by growth on the basic material.

Moreover, though the synthesis method of the present invention requires no reaction vessel or vacuum exhaust equipment, and is thus inexpensive, it has been found to facilitate the stability of operation over the extended periods of time required for industrial application. By adding steam to the synthesis atmosphere, it is possible to stabilize the synthesis operation and improve the reproducibility of the diamond's crystalline structure.

Accordingly, the present method is expected to provide products suitable for applications requiring high heat conductivity, low dielectricity, high light-transmissivity, high anelasticity, high strength, and high abrasion resistance.

Applications include use as a heat sink, an extra-high speed IC substrate IC bonder, a window material, a diaphragm, a cutting tool, or an environment-proof element.

BRIEF DESCRIPTION OF THE DRAWINGS

FIG. 1 depicts the structure of a combustion flame. The reference numerals 1, 2, and 3 designate respectively a flame cone, an inner flame, and an outer flame.

Where a combustible gas and a combustion-supporting gas are completely combusted, there is no inner flame, and the combustion flame is composed of only the flame cone and the outer flame. In this case, however, the flame is an oxidizing flame so that no diamond can be synthesized under the conditions.

If the flow rate of the combustion gas is increased so that the combustion flame has an inner flame, however, and the inner flame is contacted with a basic material as shown in FIG. 2, a diamond can be synthesized.

FIG. 1 depicts a burner tip nozzle employed in the present invention. FIGS. 2 through 5 are schematic views depicting various embodiments of diamond synthesis according to the present invention.

Figure 5:
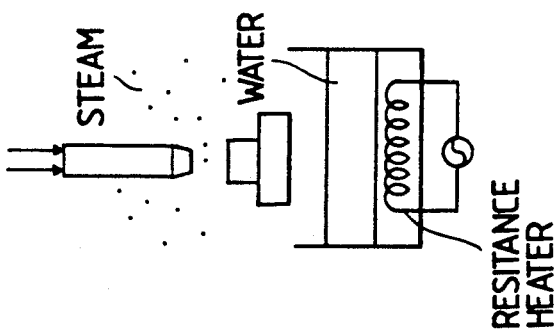
Figure 4:
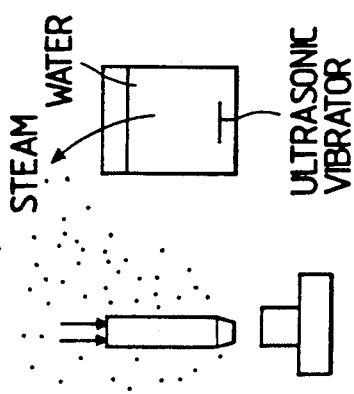
Figure 3:
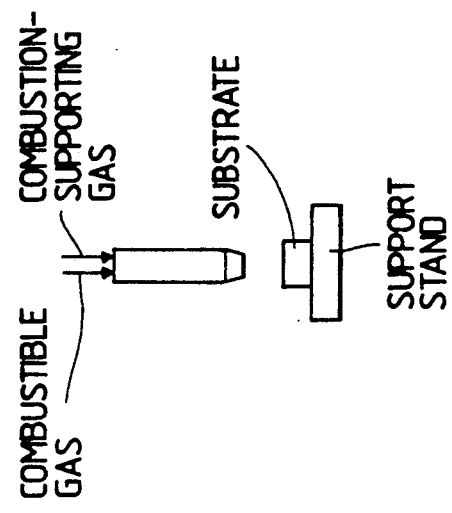

FIG. 2 depicts the case in which a cooling mechanism for adjusting the temperature of a basic material is employed, and in which an inner flame is contacted with the basic material. FIG. 3 depicts an embodiment of the present application. FIG. 4 depicts the addition of water to the synthesis atmosphere by means of a supersonic-type humidifier. FIG. 5 depicts the addition of water to the synthesis atmosphere by means of a resistor heating-type humidifier.

DESCRIPTION OF THE PREFERRED EMBODIMENTS

The various steps constituting the method of vapor-phase synthesizing diamond of the present invention will be described hereinbelow.

As raw material gases, a combustible gas (D) and a combustion-supporting gas (E) are employed. The combustible gas may be a single gas or a combination of two or more gases selected from: a combustible simple gas such as acetylene, propane, ethylene, propylene, butane, butylene, benzene, methane, ethane, or carbon monoxide; a liquefied petroleum gas (LPG) defined in the Japanese Industrial Standard (JIS) (K2240-1980); a town gas defined in the Japanese Industrial Standard (JIS) (S2121-1979); a natural gas including methane as a main component with a small amount of light hydrocarbon; a petroleum gas obtained by thermal decomposition, catalytic cracking, hydrocracking, or partial combustion; a coke oven gas (COG) obtained by carbonizing coal from a coke oven; a blast furnace gas (BFG) generated in producing pig iron in a blast furnace; a converter gas (LDG) including a substantial amount of CO (approximately 70%); a gaseous material such as coal gasification gas with CO and $H_2$ as the main components; and any of the above gaseous material further including a liquid organic compound such as an alcohol, ketone, or aldehyde, with a small quantity of oxygen, nitrogen, or sulfur.

The combustion-supporting gas may be oxygen, or a single gas or combination of two or more gases including oxygen as the main component and an inert gas such as nitrogen, argon, or helium.

It is preferable to select the mole ratio of the combustible gas (D) to the combustion-supporting gas (E) to satisfy the condition of $0.5 < D/E < 10$. If the ratio selected is such that $D/E < 0.5$, no material is deposited; if the ratio selected is such that $10 < D/E$, the quality of the diamond film is diminished.

A preferred embodiment employs acetylene as the combustible gas and oxygen as the combustion-supporting gas. Moreover, the molar ratio of acetylene to oxygen should be selected to be not less than 1.2 but not greater than 2.2.

It is preferable that the ratio of the length of the inner flame ($d_{inner\text{-}flame}$) to the length of the flame cone ($d_{flame\text{-}cone}$), and the distance ($d_{basic\text{-}material}$) between the top end of the flame cone and the basic material satisfy the following conditions:

$$1.0 < d_{inner\text{-}flame}/d_{flame\text{-}cone} < 10$$

$$0 \text{ (mm)} < d_{basic\text{-}material} < 100 \text{ (mm)}$$

In a preferred embodiment, the ratio of the length of the inner flame ($d_{inner\text{-}flame}$) to the length of the flame cone ($d_{flame\text{-}cone}$) of a burner is selected to be not less than 1.5 but not greater than 4.0. The associated distance between the basic material and the top end of the flame cone ($d_{basic\text{-}material} - d_{flame\text{-}cone}$) is selected to be not less than 0.1 mm but not greater than 30 mm.

It is further preferable to select the surface temperature of the basic material to be not lower than 800° C. but not higher than 1100° C. That is, according to the present invention, synthesis of diamond in a reducing atmosphere is best achieved under conditions of controlled temperature. The surface temperature of the basic material is preferably selected to be not lower than b 800° C. but not higher than 1000° C. Any basic material, or substrate, ordinarily employed for the vapor-phase synthesis of diamond may be used in the present invention.

According to the method of the present invention, diamond can be synthesized uniformly and stably over an extended period of time (more than several hours) if the humidity of the synthesis atmosphere is controlled. Additionally, the rate of diamond growth has been found to be several times higher than that achieved in the conventional combustion-flame method, in which humidity is not controlled.

Any suitable method may be employed to control the humidity of the synthesis atmosphere. A water tank capable of being heated by means of a resistor provided under the basic material may be used, a supersonic humidifier may be employed, or the combustor gas may be separately humidified prior to combustion. It is preferable that the humidity of the synthesis atmosphere be not less than 35% but not greater than 80%, and that the humidity be added in the form of mist-like steam.

Where a supersonic humidifier is employed, atomized water should be added to the basic material from above, maintaining the humidity in the range of not less than 35% but not greater than 80%. This method promotes both stabilization and high-rate diamond growth (higher than several hundred $\mu$ m/h). It is preferable that a small quantity of ions of potassium (K), calcium (Ca), magnesium (Mg), chlorine (Cl), or the like be mixed with the pure water prior to atomization.

The present invention is further illustrated by the following examples.

FIG.'s 1 and 2 depict a burner apparatus representative of the type used in the experiments. The burner apparatus is of the type in which a combustible gas and a combustion-supporting gas are mixed inside, with an injector structure having a needle valve so that the flow rate of the combustion-supporting gas can be adjusted. The combustion flame is composed of a flame cone conducive to reduction, an inner flame, and an outer flame conducive to oxidation.

FIG.'s 3, 4, and 5 present schematic views showing cases in which diamond is synthesized in the open atmosphere. Specifically, FIG. 4 is a schematic view showing the case in which mist-like steam is added to the synthesizing atmosphere by means of a supersonic vibrator. FIG. 5 is a schematic view showing the addition of steam by means of a bubbler heated by a resistor.

After being surface ground with #5000 diamond powder, a 10×10×0.4(100) monocrystal Si (silicon) was used as the basic material. As shown in FIG.'s 2-5, the basic material was fixed on a support capable of being cooled. The combustible gas and the combustion-supporting gas were introduced to the burner under the control of a mass flow controller. The humidity was strictly controlled by a plurality of hygrometers such as the high-accuracy electrostatic capacity type. The surface temperature of the basic material was monitored by means of an optical thermocouple.

The produced film was subject to surface structure observation with respect to its surface and section by using an optical microscope and a scanning-type electron microscope (SEM). It was additionally subject to crystal structure evaluation through X-ray diffraction and Raman spectroscopic analysis by using a transmission-type electron microscope.

The experimental conditions and results are presented in Table 1, where:

*A: sample number
*B: combustible gas (SCCM)
*C: combustion supporting gas (SCCM)
*D: humidity
*E: $d_{inner\text{-}flame}/d_{flame\text{-}cone}$
*F: $d_{basic\text{-}material} - d_{flame\text{-}cone}$
*G: method of $H_2O$ addition
*H: surface temperature of basic material
*I: rate of evaporation μm/h
*J: X-ray diffraction
*K: Raman spectral analysis
*L: remarks
*M: range of the invention
*N: range other than the invention
*S.H.: supersonic humidifying method
*R.H.: resistor-heating humidifying method.

TABLE 1

| | | | Ex. conditions | | | | | | | Ex. results | | | |
|---|---|---|---|---|---|---|---|---|---|---|---|---|---|
| | | | Feed gas and flow | | | | | | | | | | |
| | *A | | *B | | *C | *D | *E | *F | *G | *H | *I | *J | *K | *L |
| *M | 1 | $C_2H_2$ | 680 | $O_2$ | 400 | 45 | 2.3 | 1.0 | — | 950 | 180 | Dia | Dia | |
| | 2 | $C_2H_2$ | 750 | $O_2$ | 440 | 55 | 2.5 | 1.2 | *S.H. | 900 | 350 | Dia | Dia | |
| | 3 | $C_2H_2$ | 850 | $O_2$ | 500 | 60 | 2.7 | 1.5 | *R.H. | 880 | 380 | Dia | Dia | |
| | 4 | $C_2H_2$ | 300 | $O_2$ | 200 | 38 | 1.9 | 0.8 | — | 920 | 140 | Dia | Dia | |
| | 5 | $C_2H_2$ | 1550 | $O_2$ | 1000 | 65 | 3.5 | 1.2 | *S.H. | 850 | 500 | Dia | Dia | |
| | 6 | $C_2H_2$ | 140 | $O_2$ | 100 | 55 | 2.2 | 3.0 | — | 890 | 190 | Dia | Dia | |
| | 7 | $C_2H_2$ | 1900 | $O_2$ | 1200 | 50 | 4.0 | 2.0 | *S.H. | 980 | 400 | Dia | Dia | |
| | 8 | $C_3H_8$ | 1700 | $O_2$ | 800 | 48 | 3.0 | 30.0 | *S.H. | 890 | 210 | Dia | Dia | |
| | 9 | $C_3H_4$ | 2600 | $O_2$ | 900 | 70 | 6.0 | 20.0 | *S.H. | 940 | 240 | Dia | Dia | |
| | 10 | $C_2H_2$ $(CH_3)_2CO$ | 500 180 | $O_2$ | 400 | 45 | 2.3 | 7.0 | *S.H. | 870 | 300 | Dia | Dia | |
| | 11 | $C_2H_2$ $C_2H_5OH$ | 690 60 | $O_2$ | 440 | 55 | 2.8 | 2.0 | — | 820 | 180 | Dia | Dia | |
| | 12 | $C_2H_2$ $(CH_3)_2CO$ | 700 50 | $O_2$ $N_2$ | 390 50 | 60 | 2.5 | 1.8 | *R.H. | 800 | 270 | Dia | Dia | |
| | 13 | $C_2H_2$ $(CH_3)_2CO$ | 700 150 | $O_2$ $N_2$ Ar | 450 20 30 | 58 | 2.0 | 4.0 | — | 840 | 200 | Dia | Dia | |
| | 14 | $C_2H_2$ | 700 | $O_2$ | 800 | 45 | 1.1 | 1.0 | — | 900 | | No deposition | | |
| *N | 15 | $C_2H_2$ | 400 | $O_2$ | 235 | 25 | 2.5 | 2.0 | — | 750 | 20 | Dia | Dia + a–c | |
| | 16 | $C_2H_2$ | 1900 | $O_2$ | 900 | 30 | 4.0 | 0.5 | — | 1000 | 15 | Dia | Dia a–c | |
| | 17 | $C_2H_2$ | 190 | $O_2$ | 90 | 85 | 8.0 | 10.0 | — | 900 | 8 | Dia + gr | Dia + a–c | |
| | 18 | $C_2H_2$ | 270 | $O_2$ $N_2$ | 150 200 | 90 | 3.0 | 20.0 | — | 850 | | No deposition | | |

As a result of the experimentation, it has been found that diamond can best be synthesized with stability at high speed when the humidity of the synthesizing atmosphere is selected to be within a range not less than 35% but not greater than 80%. At the outside limits of the above range, the rate of growth is reduced dramatically, and the film quality becomes so poor that the diamond contains a non-diamond component.

It has further been found that the rate of growth can be remarkably improved (several hundred μm/h or more) in samples in which steam is added to the synthesizing atmosphere by means of the supersonic vibrator or the resistor heating-type humidifier. (See sample no.'s 2, 3, 5, 7, 8, 9, 10, and 12.)

What is claimed is:

1. A method of vapor-phase synthesizing diamond, comprising:
    creating a reduction atmosphere of a combustion flame by burning a combustible gas containing carbon in a combustion-supporting gas containing oxygen wherein the mole ratio of said combustible gas (D) to said combustion-supporting gas (E) is $0.5 < D < 10$;
    controlling the humidity of said reduction atmosphere to be not less than 35% and not greater than 80%;
    inserting a substrate into said combustion flame; and
    forming said diamond on said substrate.

2. A method of vapor-phase synthesizing diamond according to claim 1, wherein said combustion flame includes a flame cone and an inner flame of said reduction atmosphere, and with said substrate inserted into said inner flame so that said diamond is formed on said substrate.

3. A method of vapor-phase synthesizing diamond according to claim 2, wherein the ratio of the length of said inner flame to the length of said flame cone is $1.0 < d$: inner flame/d:flame cone $< 10$.

4. A method of vapor-phase synthesizing diamond according to claim 1, wherein said humidity is controlled by adding atomized water to said reduction atmosphere.

5. A method of vapor-phase synthesizing diamond according to claim 4, wherein said atomized water is added by means of a supersonic humidifier.

6. A method of vapor-phase synthesizing diamond according to claim 4, wherein said atomized water is added by means of a resistor heating humidifier.

7. A method according to claim 1, wherein the surface temperature of the substrate is in the range 800° to 1100° C.

8. A method according to claim 7, wherein the surface temperature of the substrate is in the range 800° to 1000° C.

9. A method according to claim 3, wherein the ratio (d:inner flame)/(d:flame cone) is between 1.0 and 10.

10. A method according to claim 8, wherein the ratio (d:inner flame)/(d:flame cone) is between 1.5 and 4.0.

11. A method according to claim 1, wherein the distance between the top end of the flame cone and the substrate is in the range 0 to 100 mm.

12. A method according to claim 10, wherein the distance between the top end of the flame cone and the substrate is in the range 0.1 to 30 mm.

13. A method according to claim 1, wherein said combustible gas containing carbon is one or more gasses selected from acetylene; propane; ethylene; propylene; butane; butylene; benzene; methane; ethane; carbon monoxide; a liquefied petroleum gas; a natural gas including methane as a main component with a small amount of light hydrocarbon; a petroleum gas obtained by thermal decomposition, catalytic cracking, hydrocracking, or partial combustion; a coke oven gas (COG) obtained by carbonizing coal from a coke oven; a blast furnace gas (BFG) generated in producing pig iron in a blast furnace; a converter gas (LDG) including a substantial amount of CO (approximately 70%; and a coal gasification gas with CO and $H_2$ as the main components.

14. A method according to claim 13, wherein said combustible gas containing carbon is acetylene.

* * * * *